United States Patent
Kung et al.

(10) Patent No.: US 9,000,452 B2
(45) Date of Patent: Apr. 7, 2015

(54) DISPLAY WITH FILTER STRUCTURE

(71) Applicant: Industrial Technology Research Institute, Hsinchu (TW)

(72) Inventors: Chen-Pang Kung, Zhongli (TW); Wen-Jen Chiang, Zhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/630,509

(22) Filed: Sep. 28, 2012

(65) Prior Publication Data

US 2014/0091327 A1    Apr. 3, 2014

(51) Int. Cl.
*H01L 27/15* (2006.01)
*H01L 31/12* (2006.01)

(52) U.S. Cl.
CPC .................................... *H01L 31/12* (2013.01)

(58) Field of Classification Search
CPC ............................ H01L 27/3269; H01L 31/12
USPC ................................. 257/84, E33.077; 362/612
See application file for complete search history.

(56) References Cited

U.S. PATENT DOCUMENTS

| | | | |
|---|---|---|---|
| 6,489,631 B2 | 12/2002 | Young et al. | |
| 6,515,428 B1 | 2/2003 | Yeh et al. | |
| 6,522,066 B2 * | 2/2003 | Sheu et al. | 313/505 |
| 7,215,073 B2 | 5/2007 | Yeh et al. | |
| 7,254,959 B1 | 8/2007 | Covert, Jr. et al. | |
| 7,940,001 B2 | 5/2011 | Park et al. | |
| 8,013,335 B2 * | 9/2011 | Yamazaki et al. | 257/57 |
| 8,379,005 B2 * | 2/2013 | Sano et al. | 345/207 |
| 2005/0040756 A1 | 2/2005 | Winters et al. | |
| 2008/0081105 A1 | 4/2008 | Suh et al. | |
| 2009/0174630 A1 | 7/2009 | Chan et al. | |
| 2009/0215220 A1 * | 8/2009 | Toda | 438/87 |
| 2009/0231511 A1 * | 9/2009 | Takahashi et al. | 349/61 |
| 2010/0201275 A1 * | 8/2010 | Cok et al. | 315/158 |
| 2011/0018815 A1 * | 1/2011 | Han et al. | 345/173 |
| 2012/0262642 A1 * | 10/2012 | Ikeda et al. | 349/46 |

FOREIGN PATENT DOCUMENTS

| | | |
|---|---|---|
| CN | 1541040 | 10/2004 |
| TW | I350713 | 10/2001 |
| TW | 200625155 | 7/2006 |
| TW | 200629231 | 8/2006 |
| TW | I305623 | 1/2009 |
| TW | 201208060 | 2/2012 |

OTHER PUBLICATIONS

K. Mameno et al., "High-Performance and Low-Power AMOLED Using White Emitter with Color-Filter Array", AMD2/OLED4-1 Invited, 2004; pp. 256-262.

(Continued)

*Primary Examiner* — Matthew Reames
(74) *Attorney, Agent, or Firm* — Muncy, Geissler, Olds & Lowe, P.C.

(57) ABSTRACT

A display is provided. The display includes a light emitting element, a filter layer and a photosensor. The filter layer is disposed on a side of the light emitting element. The filter layer includes a black filter. The photosensor is disposed corresponding with the black filter. The photosensor is used for detecting an invisible light from the black filter.

20 Claims, 8 Drawing Sheets

(56) References Cited

OTHER PUBLICATIONS

Lu Guizhu, "Research on High-resolution Color OLED Display Technology", 2010 International Conference on Optoelectronics and Image Processing, Publication Year: 2010 ;pp. 233-235.

Chih-Hao Chang et al., "Efficient White OLEDs Employing Phosphorescent Sensitization", Journal of Display Technology, vol. 3, No. 2, Jun. 2007; pp. 193-199.

Akiyoshi Mikami, "High Efficiency White-Light-Emitting Organic Devices Coupled With Lateral Color Conversion Layer", Kanazawa Institute of Technology, Ishikawa, Japan, Publication Year: 2006 pp. 498-499.

Jongwoon Park et al., "Luminance Uniformity of Large-Area OLEDs With an Auxiliary Metal Electrode", Journal of Display Technology, vol. 5, No. 8, Aug. 2009; pp. 306-311.

K. Mameno, et al., "High-Performance and Low-Power AMOLED Using White Emitter with Color-Filter Array", AMD2/OLED4-1 Invited, 2004; pp. 259-262.

Chang-Wook Han e tal., "Dual-Plate OLED Display (DOD) Embedded With White OLED", Journal of Display Technology, vol. 5, No. 12, Dec. 2009;pp. 541-545.

\* cited by examiner

DISPLAY WITH FILTER STRUCTURE

TECHNICAL FIELD

The disclosure relates in general to a display, and more particularly to a light emitting diode display.

BACKGROUND

Organic light emitting diodes (OLED) have several advantages, such as small size, long life span, low driving voltage, high responding speed, good shock resistance and low cost for large screen display production, which makes them suitable for applications that need to be light and thin. If the efficiency of the white light OLED can be further improved, it would be very applicable for a flat display, especially as a backlight source of a large screen LCD display that combines with color filters to produce various colors. Thus the development of a large screen white light OLED device is very important for the development of the full color flat display industry (especially for the LED display industry).

SUMMARY

According to one embodiment, a display is provided. The display includes a light emitting element, a filter layer and a photosensor. The filter layer is disposed on a side of the light emitting element. The filter layer includes a black filter. The photosensor is disposed corresponding with the black filter. The photosensor is used for detecting an invisible light from the black filter.

The above and other aspects of the disclosure will become better understood with regard to the following detailed description of the preferred but non-limiting embodiment(s). The following description is made with reference to the accompanying drawings.

DETAILED DESCRIPTION OF DISCLOSED EMBODIMENTS

The features and method of the disclosure are disclosed below with accompanying drawings. In the disclosure below, similar or identical elements used in different drawings are denoted by the same designations.

Figure 1:
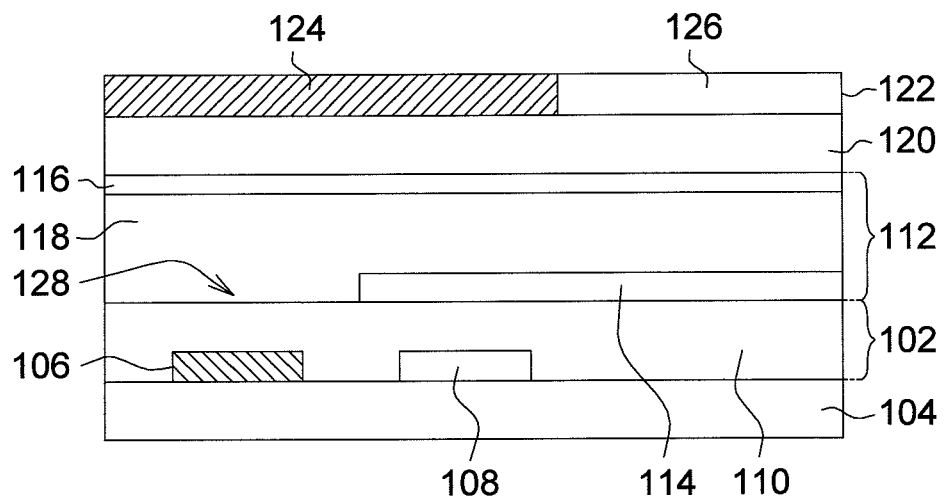
FIG. 1 illustrates a cross-section view of a display according to one embodiment.

FIG. 1 illustrates a cross-section view of a display according to one embodiment. An element layer 102 is disposed on a substrate 104. The substrate 104 may include an organic solid, an inorganic solid, or a combination of organic and inorganic solids. The substrate 104 may be rigid or flexible and can be processed as separate individual pieces, such as sheets or wafers, or as a continuous roll. The substrate 104 may include glass, plastic, metal, ceramic, semiconductor such as silicon, metal oxide, semiconductor oxide, semiconductor nitride, or combinations thereof. The substrate 104 may include a homogeneous mixture of materials, a composite of materials, or multiple layers of materials.

Referring to FIG. 1, the element layer 102 comprises a photosensor 106, a circuit element 108, and a dielectric layer 110. The photosensor 106 and the circuit element 108 are between the substrate 104 and the dielectric layer 110. A light emitting element 112 is disposed on the element layer 102. The light emitting element 112 includes a first electrode 114, a second electrode 116, and an emission layer 118. The emission layer 118 is disposed between the first electrode 114 and the second electrode 116. The first electrode 114 may be one of an anode and a cathode, and the second electrode 116 may be the other of the anode and the cathode. The emission layer 118 may include a hole-injecting layer, a hole-transporting layer, an organic light-emitting layer, an electron-transporting layer, and so on. In one embodiment, the light emitting element 112 includes, but is not limited to, a white light emitting element. In other embodiments, the light emitting element 112 includes a color light emitting element such as a red light emitting element, a green light emitting element, or a blue light emitting element. For example, the light emitting element 112 includes organic light emitting diode (OLED).

The circuit element 108 may be electrically connected to the photosensor 106 and the light emitting element 112, such as the first electrode 114 and the second electrode 116 of the light emitting element 112, through a conductive element (not shown) such as a conductive line, a conductive via, and so on formed in the dielectric layer 110. In one embodiment, the circuit element 108 is a driving circuit. The photosensor 106 and circuit element 108 may be constructed by a semiconductor device such as a transistor, a charge storage element, a MOS, and so on, respectively. The photosensor 106 and circuit element 108 may be formed by individual processes so as to have elements of similar materials. In other embodiments, the photosensor 106 and circuit element 108 may be formed by an incorporated process so as to have elements of different materials such as a-Si, poly-Si, Mo, etc. For example, the driving circuit may be electrically connected to other devices. The conductive element may include a metal such as copper, gold and so on. The conductive element may include a transparent material such as ITO and so on.

A protective layer 120 is disposed on the light emitting element 112. The protective layer 120 may be used for protecting the display from moisture or gas so as to increase the life time of the display. The protective layer 120 may include a transparent material such as glass, multi-layer stacking of organic and inorganic material as a gas barrier layer, and so on. In embodiments, the substrate 104 may function a protecting effect as the protective layer and therefore may be referred to as the protective layer.

A filter layer 122 is disposed on the protective layer 120. The filter layer 122 includes a black filter (or dark filter) 124 and a color filter 126 adjacent to the black filter 124. In embodiments, the black filter 124 is used for selecting an invisible light, such as an ultra violet light of wavelength lower than 380 nm or an infrared light or far-infrared light of wavelength higher than 780 nm, or a light of wavelength beyond wavelength of a light selected by the color filter, from an incident light. The color filter 126 may comprise a red color filter, a green color filter, a blue color filter, a white filter, a color-less transparent filter, or a combination thereof. The red color filter is used for selecting a red color light of wavelength about 600 nm~700 nm from an incident light. The green color filter is used for selecting a green color light of wavelength about 500 nm~600 nm from an incident light. The blue color filter is used for selecting a blue color light of wavelength about 380 nm~500 nm from an incident light. The white filter can be a full transparent material for any light. In one embodiment, for example, the light emitting element 112 of only white light is used with the filter layer 122 having the black filter 124 and the color filter 126. In another embodiment, the light emitting elements 112 of various colors, such as the white light organic emitting diode, the red light organic emitting diode, the green light organic emitting diode, or the blue light organic emitting diode, are used with the filter layer 122 having only the black filter 124.

In one embodiment, the display as shown in FIG. 1 is a top emission display, such as a flexible display. The first electrode 114 is opaque, and the second electrode 116 and the protective layer 120 are transparent. The opaque material may include a thick metal such as gold, copper and so on. The transparent material may include a thin metal such as gold, copper and so on, or other suitable materials such as ITO. The first electrode 114 defines an opening 128. The circuit element 108 is disposed corresponding with the black filter 124 and the first electrode 114 of the light emitting element 112. The color filter 126 is disposed corresponding with the first electrode 114. The photosensor 106 is disposed corresponding with the black filter 124 and the opening 128 defined by the first electrode 114 so that an invisible light passing through the black filter 124 and the protective layer 120 can pass through the light emitting element 112 to get into and detected by the photosensor 106. Therefore, the display can efficiently detect the invisible light condition outside the display such as an environmental light, and thus identifying accuracy can be increased.

Figure 2:
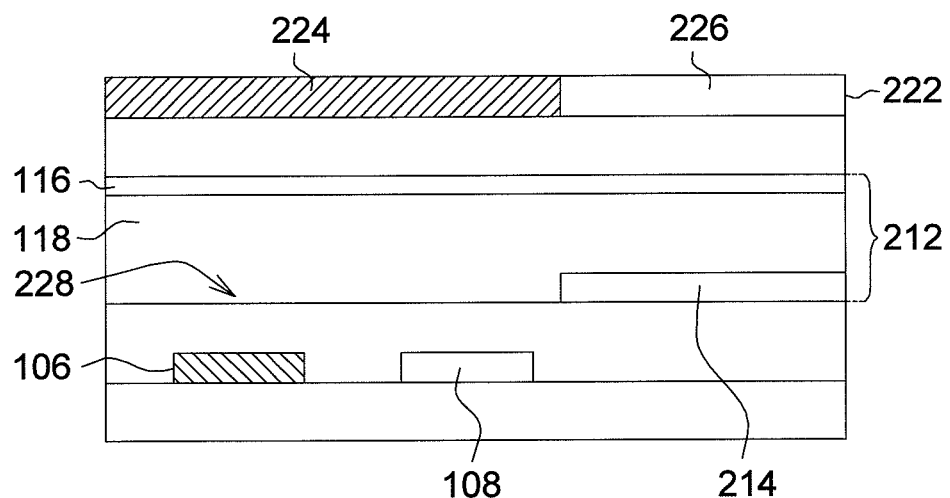
FIG. 2 illustrates a cross-section view of a display according to one embodiment.

FIG. 2 illustrates a cross-section view of a display according to one embodiment. The display as shown in FIG. 2 is different from the display as shown in FIG. 1 in that the light emitting element 212 includes the first electrode 214, the second electrode 116, and the emission layer 118 disposed between the first electrode 214 and the second electrode 116. The first electrode 214 of the light emitting element 212 defines an opening 228. The photosensor 106 and the circuit element 108 are disposed corresponding with the opening 228 defined by the first electrode 214.

Figure 3:
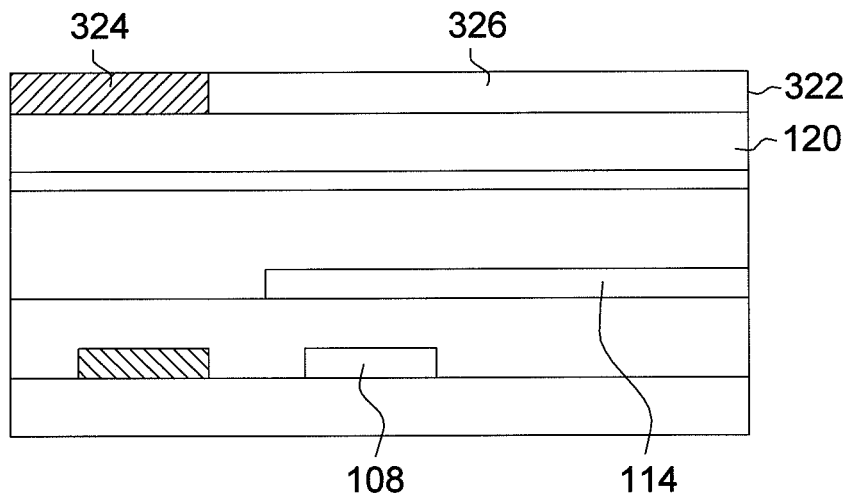
FIG. 3 illustrates a cross-section view of a display according to one embodiment.

FIG. 3 illustrates a cross-section view of a display according to one embodiment. The display as shown in FIG. 3 is different from the display as shown in FIG. 1 in that the filter layer 322 disposed on the upper surface of the protective layer 120 includes the black filter 324 and the color filter 326. The circuit element 108 is disposed corresponding with the color filter 326 and the first electrode 114.

Figure 4:
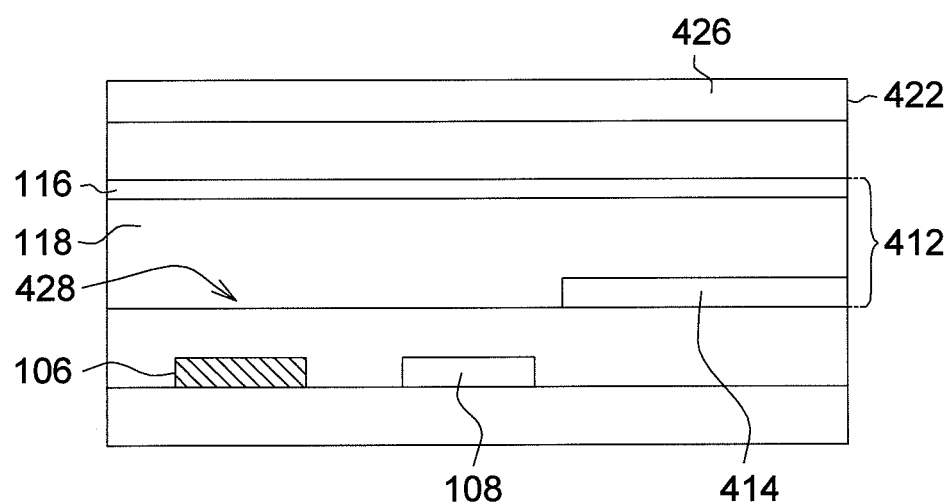
FIG. 4 illustrates a cross-section view of a display according to one embodiment.

FIG. 4 illustrates a cross-section view of a display according to one embodiment. The display as shown in FIG. 4 is different from the display as shown in FIG. 1 in that the light emitting element 412 includes the first electrode 414, the second electrode 116, and the emission layer 118 disposed between the first electrode 414 and the second electrode 116. The first electrode 414 defines the opening 428. The filter layer 422 includes the color filter 426. The photosensor 106 and the circuit element 108 are disposed corresponding with the color filter 426 and the opening 428 defined by the first electrode 414.

Figure 5:
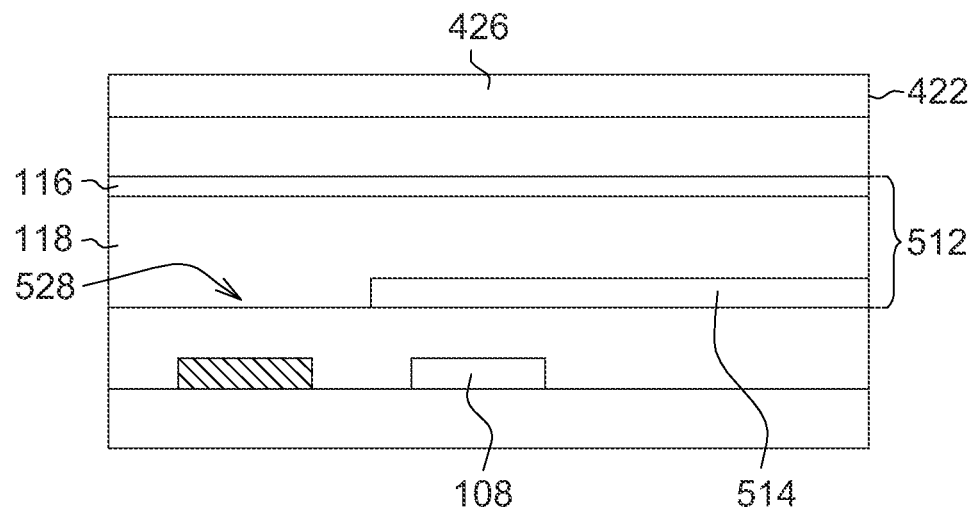
FIG. 5 illustrates a cross-section view of a display according to one embodiment.

FIG. 5 illustrates a cross-section view of a display according to one embodiment. The display as shown in FIG. 5 is different from the display as shown in FIG. 4 in that the light emitting element 512 includes the first electrode 514, the second electrode 116, and the emission layer 118 disposed between the first electrode 514 and the second electrode 116. The first electrode 514 defines the opening 528. The circuit element 108 is disposed correspond with the color filter 426 of the filter layer 422 and the first electrode 514.

In some embodiments, for example, the display includes a pixel unit as shown in FIG. 1, FIG. 2, or FIG. 3 can be incorporated with a pixel unit as shown in FIG. 4 or FIG. 5, or other kinds of pixel units.

Figure 6:
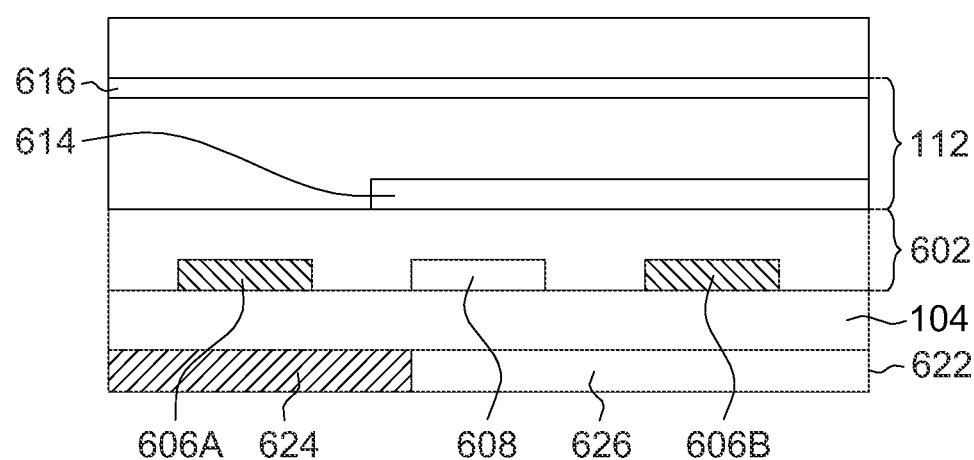
FIG. 6 illustrates a cross-section view of a display according to one embodiment.

FIG. 6 illustrates a cross-section view of a display according to one embodiment. The display as shown in FIG. 6 is different from the display as shown in FIG. 3 in that display as shown in FIG. 6 is a bottom emission display, such as a flexible display. For example, the first electrode 614 and the substrate 104 are transparent, and the second electrode 616 is opaque. The element layer 602 includes circuit element 608 electrically connected to the photosensors 606A, 606B and the light emitting element 112. The element layer 602 and the filter layer 622 including the black filter 624 and the color filter 626 are disposed on the same side of the light emitting element 112. The photosensor 606B is disposed corresponding with the color filter 626. The photosensor 606A is disposed corresponding with the black filter 624 and the opening 628 defined by the first electrode 614 so that an invisible light passing through the black filter 624 and the substrate 104 can get into and detected by the photosensor 606A. Therefore, the display can efficiently detect the invisible light condition outside the display such as an environmental light, and thus identifying accuracy can be increased.

Figure 7:
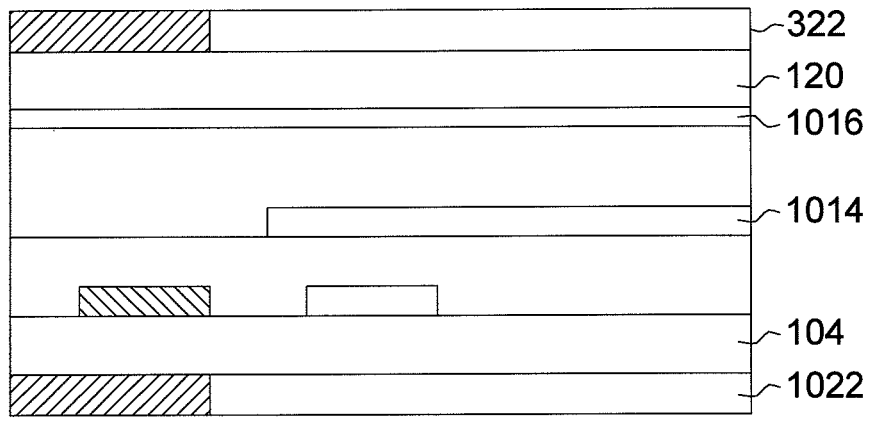
FIG. 7 illustrates a cross-section view of a display according to one embodiment.

FIG. 7 illustrates a cross-section view of a display according to one embodiment. The display as shown in FIG. 7 is different from the display as shown in FIG. 3 in that the filter layer 322 is disposed on the upper surface of the protective layer 120, and the filter layer 1022 is disposed on a lower surface of the substrate 104. In one embodiment, the display as shown in FIG. 7 is a top-bottom (two-side) emission display, such as a flexible display. For example, the substrate 104, the first electrode 1014, the second electrode 1016 and the protective layer 120 are transparent.

Figure 8A:
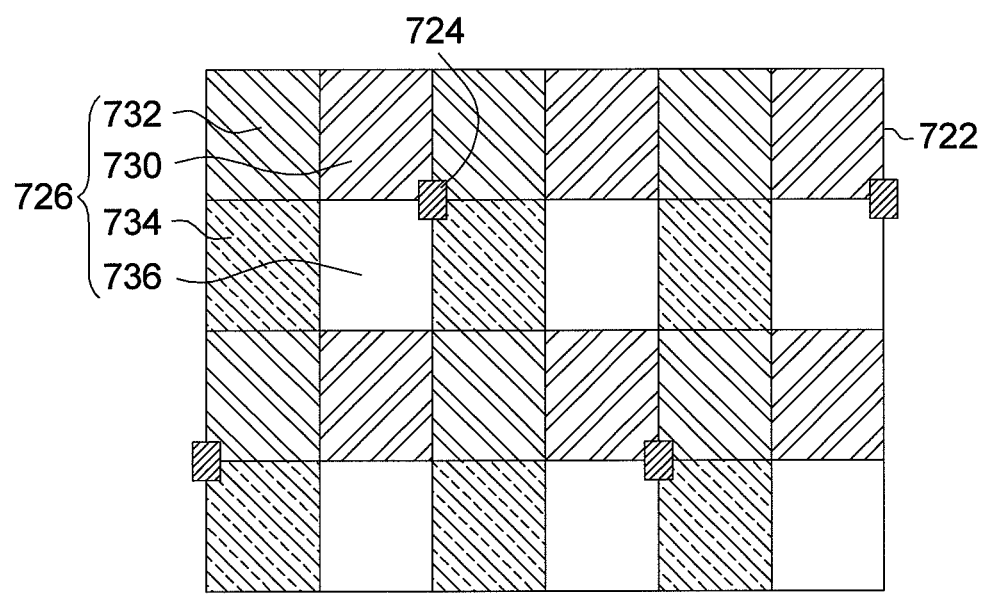
FIG. 8A illustrates a top view of a filter layer of a display according to one embodiment.
Figure 8B:
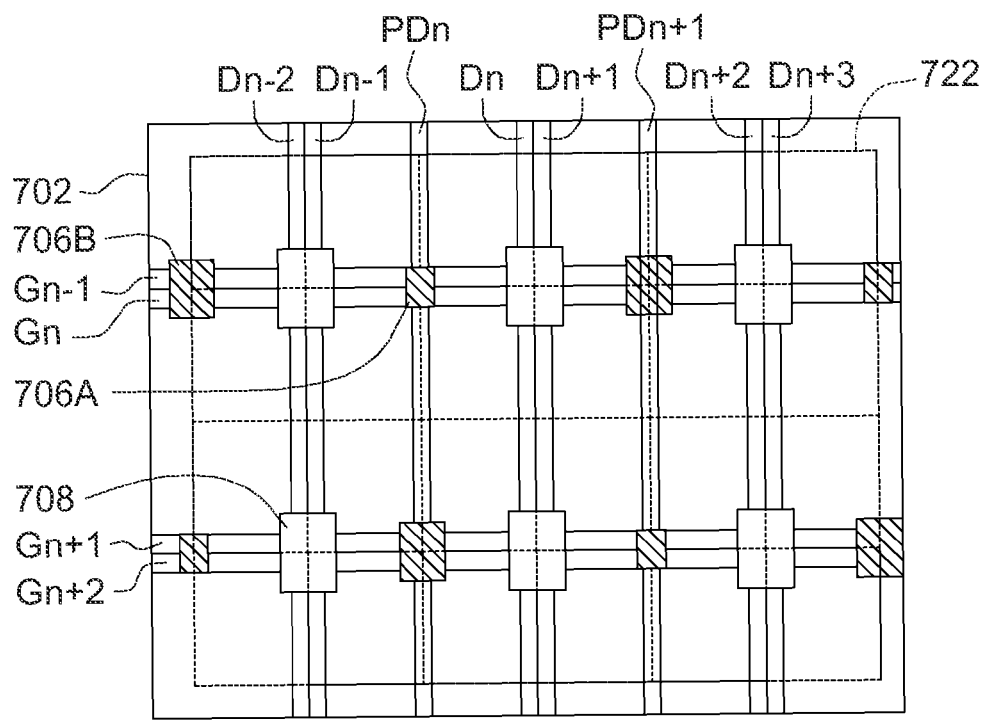
FIG. 8B is a schematic drawing showing an arrangement of a filter layer and an element layer of a display according to one embodiment.

FIG. 8A illustrates a top view of the filter layer 722 of a display according to one embodiment. FIG. 8B is a schematic drawing showing an arrangement of the filter layer 722 and the element layer 702 according to one embodiment. Referring to FIG. 8A, the filter layer 722 includes a plurality of pixel units that include the black filter 724 surrounded by the color filter 726 including the red color filter 730, the green color filter 732, the blue color filter 734 and the white filter 736. Referring to FIG. 8B, the element layer 702 below the filter layer 722 includes the photosensor 706A disposed corresponding with the black filter 724 (FIG. 8A). The element layer 702 includes the photosensor 706B disposed corresponding with the color filter 726. The circuit element 708, such as the driving circuit, and the photosensors 706A, 706B are electrically connected to gate lines Gn−1~Gn+2, data lines Dn−2~Dn+3, and photosensor data lines PDn, PDn+1 as shown in FIG. 8B. The circuit element 708, such as the driving circuit, and the photosensors 706A, 706B are electrically connected to gate lines Gn−1~Gn+2, data lines Dn−2~Dn+3, and photosensor data lines PDn, PDn+1as shown in FIG. 8B.

Figure 9A:
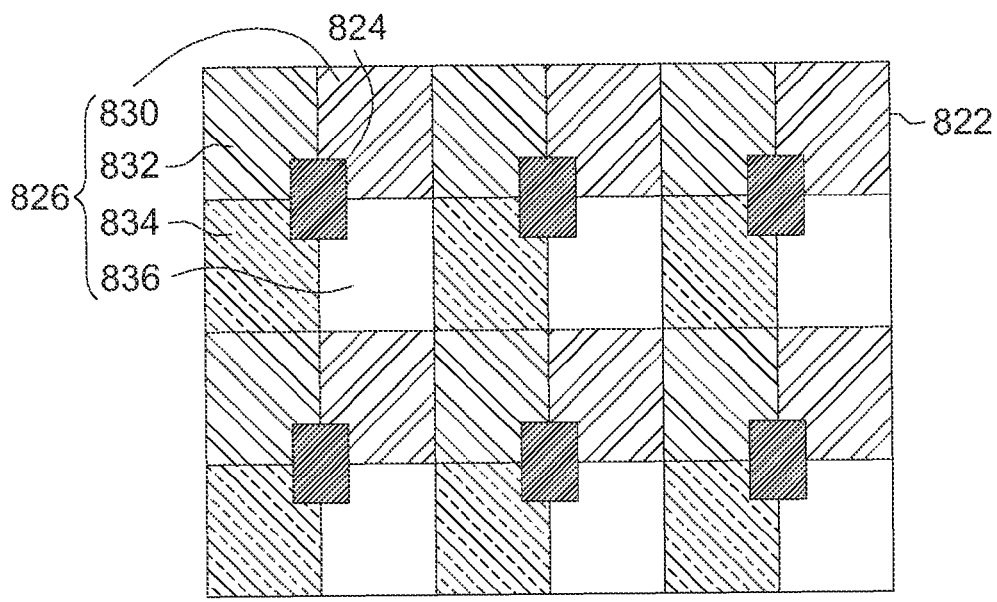
FIG. 9A illustrates a top view of a filter layer of a display according to one embodiment.
Figure 9B:
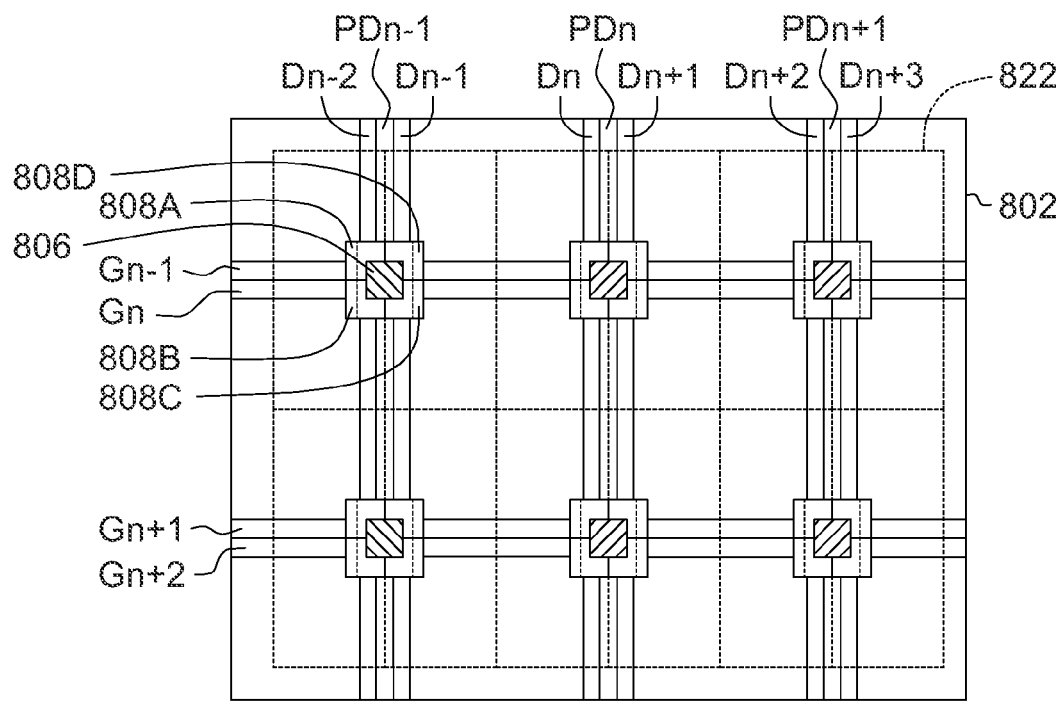
FIG. 9B is a schematic drawing showing an arrangement of a filter layer and an element layer of a display according to one embodiment.

FIG. 9A illustrates a top view of the filter layer (822) of the display according to one embodiment. FIG. 9B is a schematic drawing showing an arrangement of the filter layer 822 and the element layer 802 according to one embodiment. Referring to FIG. 9A, the filter layer 822 includes the black filter 824 surrounded by the color filter 826 including the red color filter 830, the green color filter 832, the blue color filter 834 and the white filter 836. Referring to FIG. 9B, the element layer 802 below the filter layer 822 includes the photosensor 806 disposed corresponding with the black filter 824 (FIG. 9A). The circuit elements 808A~808D, such as the driving circuit, and the photosensor 806 are electrically connected to gate lines Gn−1~Gn+2, data lines Dn−2~Dn+3, and photosensor data lines PDn−1~PDn+1 as shown in FIG. 9B.

Figure 10A:
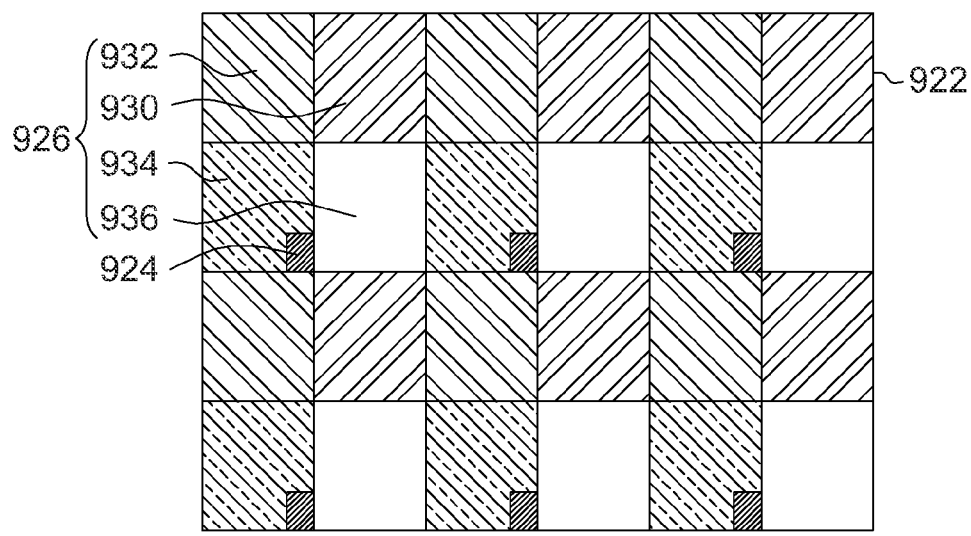
FIG. 10A illustrates a top view of a filter layer of a display according to one embodiment.
Figure 10B:
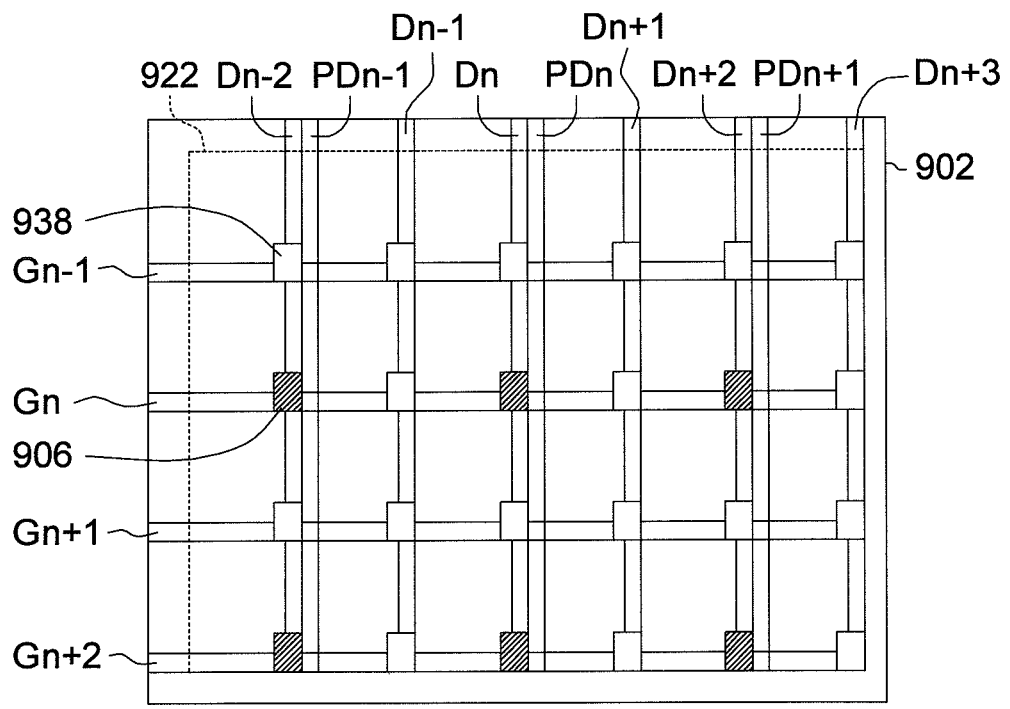
FIG. 10B is a schematic drawing showing an arrangement of a filter layer and an element layer of a display according to one embodiment.

FIG. 10A illustrates a top view of the filter layer 922 of the display according to one embodiment. FIG. 10B is a schematic drawing showing an arrangement of the filter layer 922 and the element layer 902 according to one embodiment. Referring to FIG. 10A, the filter layer 922 includes the black filter 924 and the color filter 926 including the red color filter 930, the green color filter 932, the blue color filter 934 and the white filter 936. The black filter 924 is disposed at a corner of the blue color filter 934. Referring to FIG. 10B, the element layer 902 below the filter layer 922 includes the photosensor 906 disposed corresponding with the black filter 924 (FIG. 10A). The circuit element (not shown), such as the driving circuit, or the another photosensor (not shown) may be disposed on a region 938 of the element layer 902 corresponded with the color filter 926 (FIG. 10A). The photosensor 906 and the elements such as the circuit element (not shown) or the another photosensor (not shown) are electrically connected to gate lines Gn−1~Gn+2, data lines Dn−2~Dn+3, and photosensor data lines PDn−1~PDn+1 as shown in FIG. 10B.

Figure 11A:
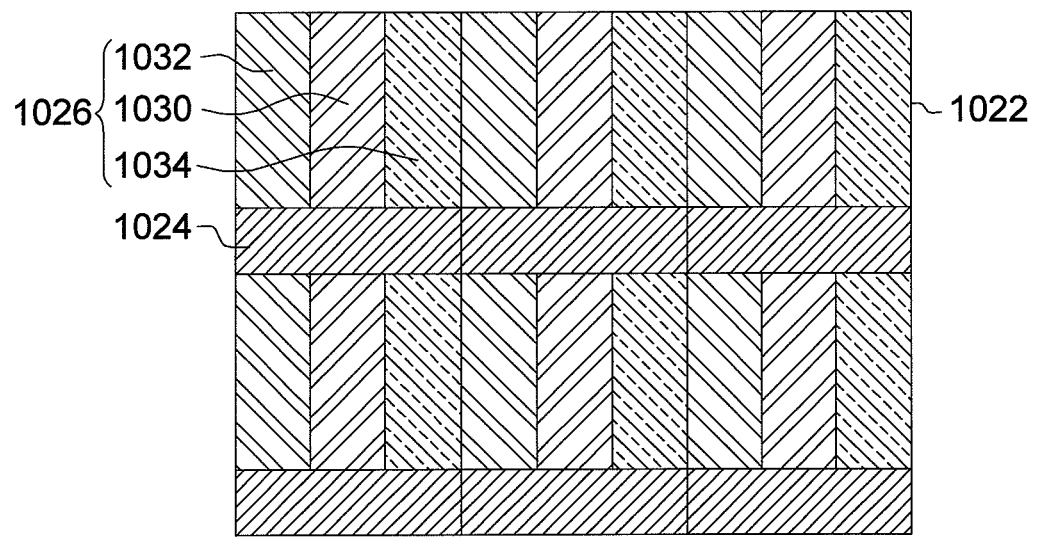
FIG. 11A illustrates a top view of a filter layer of a display according to one embodiment.
Figure 11B:
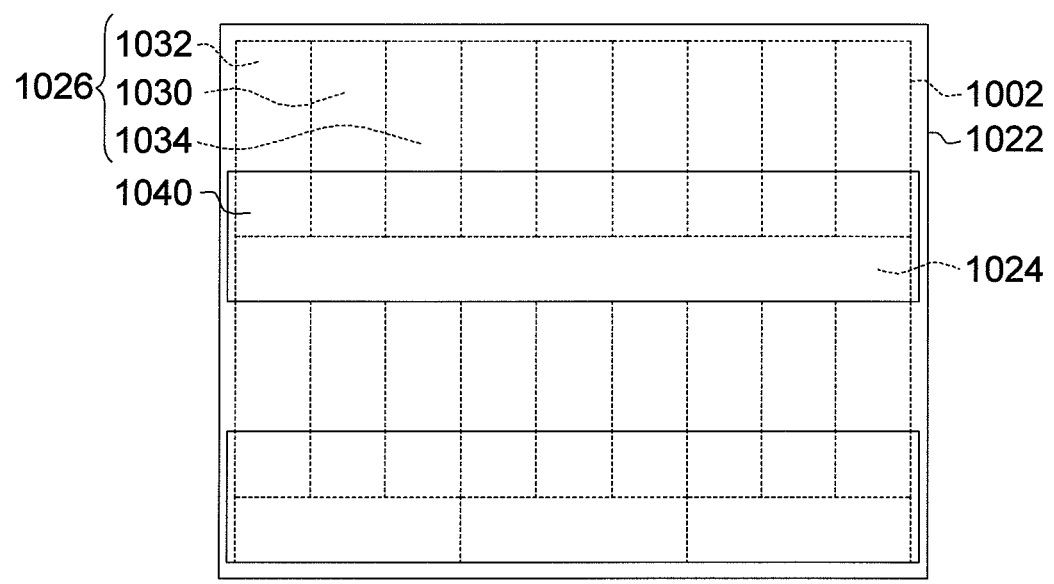
FIG. 11B is a schematic drawing showing an arrangement of a filter layer and an element layer of a display according to one embodiment.

FIG. 11A illustrates a top view of the filter layer 1022 of the display according to one embodiment. FIG. 11B is a schematic drawing showing an arrangement of the filter layer 1022 and the element layer 1002 according to one embodiment. Referring to FIG. 11A, the filter layer 1022 includes the black filter 1024 and the color filter 1026 including the red color filter 1030, the green color filter 1032, and the blue color filter 1034. The black filter 1024 is disposed between the two red color filters 1030, the two green color filters 1032 and the two blue color filters 1034. Referring to FIG. 11B, the element layer 1002 below the filter layer 1022 includes a region 1040 corresponded with the black filter 1024 and the color filter 1026, wherein the photosensor (not shown) and the circuit element (not shown), such as the driving circuit, may be disposed.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is :

1. A display, comprising:
   a light emitting element including a first electrode;
   a filter layer including a black filter and stacked on a side of the light emitting element along a first direction; and
   a photosensor stacked under the light emitting element, wherein the first electrode defines an opening to expose the photosensor, such that the black filter completely overlaps the photosensor under or over the black filter along the first direction.

2. The display according to claim 1, wherein the photosensor is disposed on a side of the light emitting element opposite to the side of the light emitting element that the filter layer is disposed on.

3. The display according to claim 1, wherein the filter layer and the photosensor are disposed on the same side of the light emitting element.

4. The display according to claim 1, further comprising a circuit element electrically connected to the photosensor and the light emitting element.

5. The display according to claim 4, wherein the circuit element is a driving circuit.

6. The display according to claim 4, wherein the circuit element is disposed corresponding with the black filter.

7. The display according to claim 4, wherein the circuit element and the photosensor are disposed on a side of the light emitting element opposite to the side of the light emitting element that the filter layer is disposed on.

8. The display according to claim 4, wherein the circuit element, the filter layer and the photosensor are disposed on the same side of the light emitting element.

9. The display according to claim 1, wherein the light emitting element includes a white light emitting element.

10. The display according to claim 1, wherein the light emitting element includes:
    a second electrode; and
    an emission layer disposed between the first electrode and the second electrode.

11. The display according to claim 10, wherein the opening corresponds with the black filter and the photosensor.

12. The display according to claim 10, further comprising a circuit element electrically connected to the photosensor and the light emitting element, wherein the circuit element is disposed corresponding with the opening defined by the first electrode.

13. The display according to claim 10, further comprising a circuit element electrically connected to the photosensor and the light emitting element, wherein the circuit element is disposed corresponding with the first electrode.

14. The display according to claim 10, wherein one of the first electrode and the second electrode is opaque and the other of the first electrode and the second electrode is transparent.

15. The display according to claim 1, wherein the filter layer includes a color filter adjacent to the black filter, and the color filter comprises a red color filter, a green color filter, a blue color filter, and a white filter, a color-less transparent filter, or a combination thereof.

16. The display according to claim 15, further comprising another photosensor disposed corresponding with the color filter.

17. The display according to claim 15, further comprising a circuit element electrically connected to the photosensor and the light emitting element, wherein the circuit element is disposed corresponding with the color filter.

18. The display according to claim 15, wherein the light emitting element includes:
   a second electrode; and
   an emission layer disposed between the first electrode and the second electrode,
   wherein the color filter is disposed corresponding with the first electrode.

19. The display according to claim 1, further comprising a protective layer disposed on a side of the light emitting element.

20. The display according to claim 19, wherein the protective layer is disposed between the filter layer and the light emitting element.

* * * * *